United States Patent [19]

Yokoyama et al.

[11] Patent Number: 5,558,749
[45] Date of Patent: Sep. 24, 1996

[54] MAGNETRON SPUTTERING APPARATUS AND METHOD

[75] Inventors: Masahide Yokoyama, Hirakata; Hiroshi Hayata, Neyagawa, both of Japan

[73] Assignee: Matsushita Electric Industrial Co., Ltd., Osaka-fu, Japan

[21] Appl. No.: 499,194

[22] Filed: Jul. 7, 1995

[30] Foreign Application Priority Data

Jul. 8, 1994 [JP] Japan ................................. 6-157531

[51] Int. Cl.⁶ ................................................. C23C 14/34
[52] U.S. Cl. ..................... 204/192.12; 204/298.09; 204/298.11; 204/298.19; 204/298.2
[58] Field of Search ................. 204/192.12, 298.09, 204/298.11, 298.08, 298.16, 298.17, 298.19, 298.2, 298.22

[56] References Cited

U.S. PATENT DOCUMENTS

| | | | |
|---|---|---|---|
| 4,370,217 | 1/1983 | Funaki | 204/298.19 X |
| 4,385,979 | 5/1983 | Pierce et al. | 204/298.19 X |
| 5,069,772 | 12/1991 | Fritsche et al. | 204/298.2 X |
| 5,133,850 | 7/1992 | Kukla et al. | 204/298.19 X |
| 5,266,178 | 11/1993 | Sichmann | 204/298.19 |

FOREIGN PATENT DOCUMENTS 61-187336  8/1986  Japan .

*Primary Examiner*—Nam Nguyen
*Attorney, Agent, or Firm*—Wenderoth, Lind & Ponack

[57] ABSTRACT

A magnetron sputtering apparatus has a ring-shaped flat target and includes magnets of the same polarity respectively arranged at a front side and a rear side of the target extending along an inner peripheral edge of the target, and magnets of the same polarity respectively arranged at the front side and the rear side of the target extending along an outer peripheral edge of the target. The magnets extending along the inner peripheral edge of the target are inverted in polarity relative to the other magnets extending along the outer peripheral edge of the target.

22 Claims, 7 Drawing Sheets

5,558,749

MAGNETRON SPUTTERING APPARATUS AND METHOD

BACKGROUND OF THE INVENTION

The present invention relates to a magnetron sputtering apparatus and method having a ring-shaped flat target.

Magnetron sputtering technology has been used to deposit thin films on substrates. Because of its capability of high-speed processing at low temperatures, magnetron sputtering is executed in most of the current film forming apparatuses. According to the magnetron sputtering, ions of plasma generated in the vicinity of a target by discharging or the like are let to collide with the target, thereby sputtering and adhering particles to a substrate and forming a thin film on the substrate.

A conventional example will be described with reference to FIGS. 9, 10, and 11.

FIG. 9 is a sectional view of a cathode part of a conventional magnetron sputtering apparatus using a ring-shaped flat target. The cathode part is symmetrical with respect to a central axis 1. Magnets 3 are arranged at a rear surface of a ring-shaped flat target 2, which form magnetic fields 4. With the thus-constituted cathode part set in a vacuum chamber in a manner that a front surface of the target 2 faces a to-be-processed substrate, when the electricity is supplied to the target 2 from a high voltage power source for glow discharge after a sputtering gas is introduced into the chamber, a high-density plasma enclosed by lines of magnetic force is generated. As ions in the plasma collide against the front surface of the target, atoms of the target are sputtered to adhere to a confronting surface of the substrate, thereby forming a thin film on the substrate. A speed to sputter/erode the target 2 is fast in the vicinity of an area 5 where the plasma is in a high density, and is locally accelerated in the vicinity of an area 6.

FIG. 10 is a sectional view of the sputtered target including the central axis 1 when the target of FIG. 9 is used to its using limit. A half of the target symmetric to the central axis is abbreviated in FIG. 10. Reference numerals in FIG. 10 indicate: 9 an original shape of the target before being sputtered; 10 a sputtered part of the target; and 11 a part left without being sputtered. As is apparent in FIG. 10, the target is most sputtered in the vicinity of a D point, resulting in the formation of a V-shaped sputtered eroded surface. In the case where the sputtering is carried out in the above manner to cause the above V-shaped sputtered surface, a voluminal using efficiency of the target, namely, a volume ratio of the sputtered part of the target to the target before being sputtered (including the volume inside its inner periphery) when the target is used to the using limit is approximately 20%. In other words, the target which is expensive is impossible to fully utilize in the conventional arrangement. Moreover, a film forming speed or a film thickness distribution disadvantageously changes with time when the target is sputtered with an irregular erosion accompanied as in FIG. 10.

For solving the aforementioned problems, new technical ideas have been actually discussed as in Japanese Laid-Open Patent Publication Nos. 5-209266 (209266/1993) and 5-179440 (179440/1993). A cathode for magnetron sputtering disclosed in Japanese Laid-Open Patent Publication No. 5-209266 has magnets arranged at a rear surface of a target similarly to the conventional example of FIG. 9, and also ferromagnetic bodies are provided both in an outer and in an inner peripheries of the target, so that a magnetic flux spreads over a front surface of the target. Accordingly, a plasma density is averaged and consequently the target is more smoothly and uniformly sputtered/eroded.

FIG. 11 is a sectional view showing a sputtered target when the target is used in the cathode for magnetron sputtering of Japanese Laid-Open Patent Publication No. 5-209266 to the using limit. Similar to FIG. 10, reference numerals in FIG. 11 respectively represent: 9 an original shape of the target before sputtering; 10 a sputtered part thereof; and 11 a part left without being sputtered. In comparison with FIG. 10, the sputtering is more uniformly proceeded in FIG. 11, whereas the sputtering speed is locally increased in the vicinity of an E point. The using efficiency of the target in terms of volume at this time including the volume inside the inner periphery of the target is near 40%.

In the prior art wherein the magnets are set at the rear surface of the target, the sputtering generates the V-shaped sputtered surface as shown in FIG. 10. The target becomes locally thin if the sputtering proceeds in this manner to form a V-shaped surface, and is eventually impossible to use beyond its using limit, in other words, as soon as the thickness of the locally thin part reaches a predetermined value or smaller even if a sufficient amount of material to form thin films remains in the target. The target which is expensive is also impossible to fully utilize in this arrangement. If the sputtering is continued locally fast, the distribution of sputtered particles is changed with time, thus changing an adhering rate of particles to the substrate. As a result, even when the thickness of the film formed on the substrate in an early stage of the sputtering is uniform, the thickness is unfavorably turned not uniform in a final stage.

As indicated in FIG. 11, the local erosion by sputtering is given rise to in the vicinity of the E point even in the arrangement proposed in Japanese Laid-Open Patent Publication No. 5-209266, whereby the voluminal using efficiency of the target is decreased and the thickness of the thin film adhering to the substrate is rendered irregular.

In a diagram of FIG. 8, a change with time of the thickness distribution of a thin film formed on a substrate of a 40 mm inner diameter and a 120 mm outer diameter is represented with respect to integrating watts. An axis of ordinate indicates a relative film thickness when an edge at an inner periphery of the substrate has a thickness of 1, and an axis of abscissa shows a distance from a central point of the substrate. As is clear from FIG. 8, the thickness distribution changes large with time in the conventional example.

SUMMARY OF THE INVENTION

The object of the present invention is therefore to provide a magnetron sputtering apparatus and method which can effectively prevent a local irregular erosion of a target by sputtering, with eliminating the problems inherent in the prior art.

A direction in which particles are sputtered is dependent on a direction of a surface of a target in a sputtering apparatus. Therefore, the thickness of a thin film formed on a surface of a substrate changes with time when an angle defined by the target surface and substrate surface is changed with time subsequent to sputtering, i.e., erosion by sputtering. Since the target is flat and arranged in parallel to the substrate surface in the early stage of sputtering, the thin film formed on the substrate surface is nearly uniform. However, when the target surface is curved in accordance with the progress of sputtering, the thickness of the thin film on the substrate surface becomes irregular. As such, in order to maintain the film thickness uniform, a sputtered surface should remain similar to a flat surface parallel to the original target surface even after the advancement of sputtering, with the consequence that the state of the target in the early sputtering stage is hardly different from that when the target is used to the using limit. The thickness distribution of the thin film is advantageously hard to change with time even when the erosion by sputtering proceeds further.

If the erosion is brought about locally fast, the target becomes impossible to use when the film thickness at the part is not larger than a predetermined value. The sputtering should be carried out as uniformly as possible so as to enhance the using efficiency of the target.

The magnetron sputtering technology is characterized in that particles rotated by an electromagnetic force of an outer product of a speed vector of ions and a vector of a magnetic field collide against the target with increasing such opportunities. A chance for ions to collide against the target is dependent on a rotating cycle of ions. The shorter the rotating cycle is, i.e., the more intense the magnetic field is and the faster the ions move, more and more chances are ensured. Therefore, the magnetic field should be made vertical to an electric field activating the ions so that the outer product becomes maximum. Since the electric field is generally formed at right angles to the target surface, the magnetic field is desired to be formed in parallel to the target surface. Moreover, since the sputtering speed is dependent also on the density of plasma, the magnetic field is needed to be formed in parallel to the target surface all over the target surface and have a uniform intensity to distribute the plasma as uniformly as possible.

Inventors of the present invention set magnets at the front and rear surfaces of the target along the inner and outer peripheries of the target to realize the magnetic field required as above. Moreover, polarities of magnets facing each other via the target are made opposite. Accordingly, the magnetic field is formed furthermore parallel to the target surface with a nearly uniform intensity, which is confirmed through computer simulation. FIG. 2 shows lines of magnetic force in the vicinity of a section of the target through computer simulation. The magnetic field is nearly parallel to the target surface at the target surface without a large intensity difference, that is, without a large difference of intervals of lines of magnetic force. The plasma is distributed uniformly within the magnetic field, and at the same time, ions are rotated with the uniform cycle, so that the target is sputtered uniformly.

If the intensity of magnets is adjusted so that there is at least one point present in the target where the magnetic field is parallel to the target surface in a radial direction, the magnetic field is directed more parallel to the target surface, thereby enhancing the effect of the present invention.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

Figure 1A:
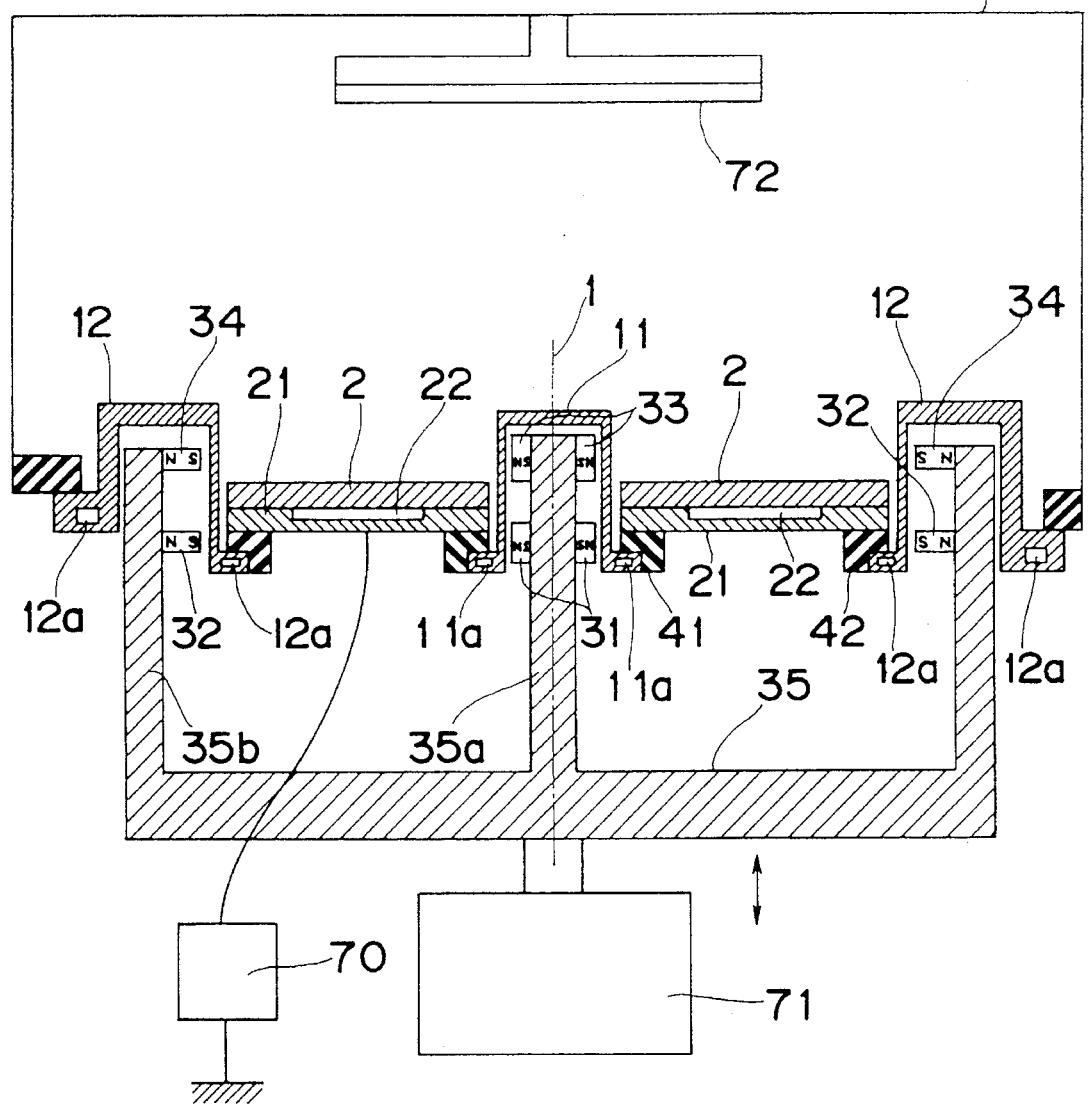
FIG. 1A is a diagram of a magnetron sputtering apparatus according to an embodiment of the present invention.

Before the description of the present invention proceeds, it is to be noted that like parts are designated by like reference numerals throughout the accompanying drawings.

A magnetron sputtering apparatus in an embodiment of the present invention will be described with reference to FIGS. 1A, 1B and 2–7. The magnetron sputtering apparatus uses a ring-shaped target of a 32 mm inner diameter, a 152 mm outer diameter and a 6 mm thickness.

Figure 1B:
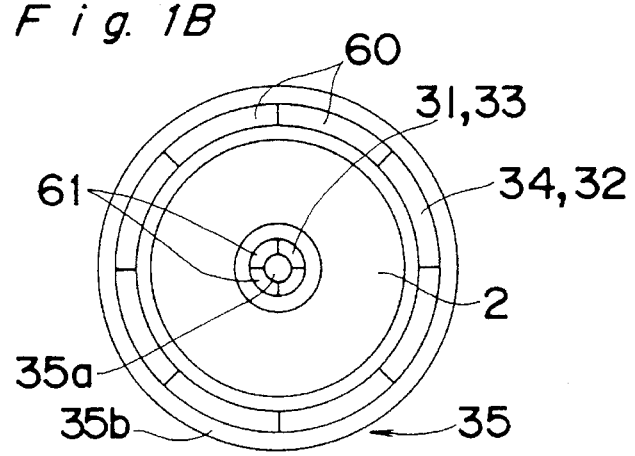
FIG. 1B is a plan view of the apparatus of FIG. 1A.

FIG. 1A is a structural diagram of the magnetron sputtering apparatus of the embodiment. FIG. 1B is a plan view of the apparatus. A magnetron sputtering method according to an embodiment of the present invention will be described in the description of the apparatus.

A cathode part used in the apparatus is symmetric with respect to a central axis 1. The ring-shaped target 2 is surrounded by an outer earth shield 12 in an outer periphery thereof and encompasses an inner earth shield 11. A yoke 35 supporting the cathode part is made of magnetic substance of SS41 alloy and has a side plate (outer peripheral part 35b) of a 180 mm inner diameter, a 9 mm thickness, and a 90 mm height; a bottom plate of a 15 mm thickness; and a cylindrical projection (center part 35b) of a 10 mm diameter and a 87.5 mm height from the bottom plate. The target 2 is preferably made of material such as aluminum alloy or dielectric substance including $SiO_2$. The yoke 35 is preferably made of material such as stainless steel in the SUS400 range or ferrous magnetic substance. In FIGS. 1A and 1B, reference numeral 35a denotes the center part of the yoke 35 and 35b denotes the outer peripheral part thereof. In FIG. 1A, 73 denotes a vacuum chamber, 72 a substance, 70 a source for supplying a high frequency electric power to an electrode which is a rear plate 21 described below. Instead of the high frequency power source, a DC power source may be used.

A rear plate 21 is in touch with a rear surface of the target 2. The target 2 is cooled when the water is fed to a gap 22 between the rear surface of the target 2 and the rear plate 21. A feeding/discharging means for feeding the water into the gap 22 and discharging it therefrom is not indicated in FIG. 1A. The rear plate 21 is preferably made of material such as SUS304 when it is important to prevent a gas adsorbed in the material from generating or SUS303 when it is important to easily process the material.

The target 2 and rear plate 21 are insulated from the earth shields 11 and 12 by insulations 41 and 42. Instead, the earth shields 11 and 12 may be electrically floated against the target 2 and rear plate 21. An application means for applying a negative potential to the target 2 is the source 70. The insulations 41 and 42 are preferably made of material such as alumina or polytetrafluoroethylene. The earth shields 11 and 12 are preferably made of material such as nonmagnetic substance of copper etc. or feeble magnetism substance of SUS303 or SUS304. Paths 11a and 12a for flowing cooling water are provided at the lower parts of the earth shields 11 and 12 to cool the earth shields 11 and 12 with the water.

A pair of ring-shaped permanent magnets 31 and 33 are arranged inside the inner earth shield 11. Each permanent magnet 31, 33 has a 10 mm inner diameter, a 5 mm thickness, and a 10 mm height and is made of a material of 12.1 kilo-gauss remanent magnetic flux density and 11.6 kilo-oersted coercive force. One permanent magnet 33 is located at a front side of the target 2, while the other permanent magnet 31 is positioned at a rear side of the target 2. N poles of the magnets 33, 31 are at sides of outer peripheries of the magnets 33, 31. Moreover, a pair of ring-shaped permanent magnets 32 and 34 of a 162 mm inner diameter, a 9 mm thickness, and a 5 mm height are disposed inside the outer earth shield 12, which are made of the same material as that of the magnets 31 and 33. The permanent magnets 34 and 32 are respectively at the front side and rear side of the target 2. S poles of the permanent magnets 34, 32 are at sides of inner peripheries of the magnets 34, 32. The permanent magnets 31 and 33 are preferably made of neodymium-ferrous-boron. Each of the magnets 31, 33, 34, 32 may be composed of a plurality of separated members 61, 60 as shown in FIG. 1b. The poles of 10 the magnets 31, 33, 34, 32 may be opposite to those of the magnets in FIGS. 1A and 1B, that is, S poles of the magnets 31, 33 instead of the N poles thereof are arranged to face the target 2 while N poles of the magnets 34, 32 instead of the S poles thereof are arranged to face the target 2. The center axes of the magnets 33, 31 on the inner peripheral side of the target 2 in the lateral direction in FIG. 1A are approximately aligned with the center axes of the magnets 34, 32 on the outer peripheral side of the target 2 in the lateral direction, respectively.

Since the intensity and ring shape of each permanent magnet 31, 32, 33, 34, the distance of magnets and the shape of the yoke 35 are selected as above, there may be two points present in a radial direction on the surface of the target 2 where the lines of magnetic force are paralleled to tile surface of the target 2. The number of the points where the lines of magnetic force are paralleled to the surface of the target 2 may be one instead of two as described above.

Figure 2:
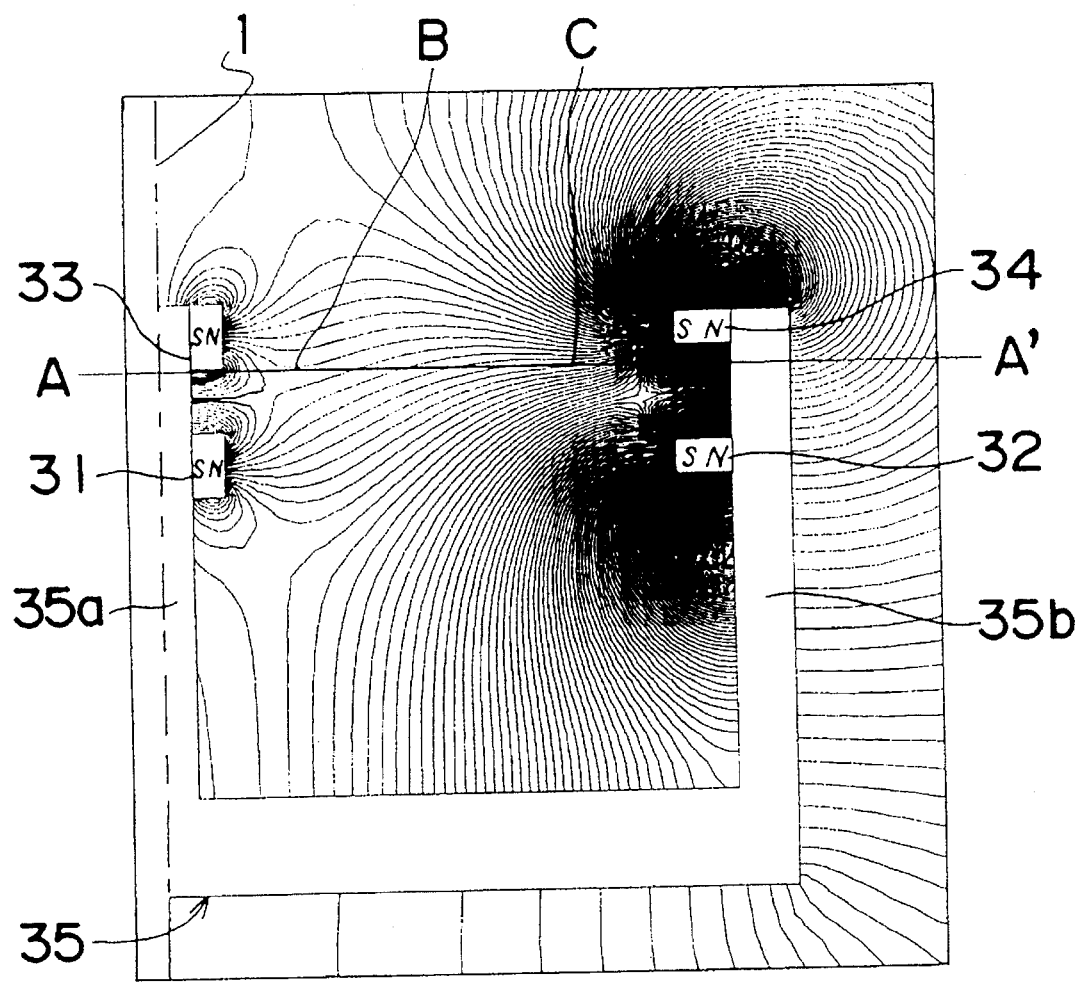
FIG. 2 is a computer-simulated view of a magnetic field formed according to the embodiment of the present invention.

FIG. 2 is a computer-simulated view of lines of magnetic force on a section of the target 2 passing the central axis 1 when the permanent magnets 31, 32, 33, 34 are arranged as in the above embodiment. Lines of magnetic force at half of the target are abbreviated because the lines are formed symmetrically to the central axis 1. In FIG. 2, when the target 2 is disposed so that the surface thereof is in the vicinity of a line A-A', lines of magnetic force become parallel to the target surface in the vicinity of a point B and a point C.

The cathode part in the above constitution operates within the magnetron sputtering apparatus in a manner as will be described below.

The cathode part of FIGS. 1A and 1B is set in the vacuum chamber 73, similar to the prior art, so that the central axis 1 thereof agrees with that of a substrate 72 of a 40 mm inner diameter and a 120 mm outer diameter to face the target surface via a 35 mm gap. After a sputtering gas is sent into the chamber 73, when the electricity is supplied to the target 2 from a high voltage power source 70 for glow discharge, a high-density plasma for sputtering which is enclosed by lines of magnetic force is generated. Atoms of the target 2 are sputtered when the ions in the plasma collide with the target surface, to adhere to an opposite surface of the substrate 72, whereby a thin film is formed on the substrate 72.

Figure 3:
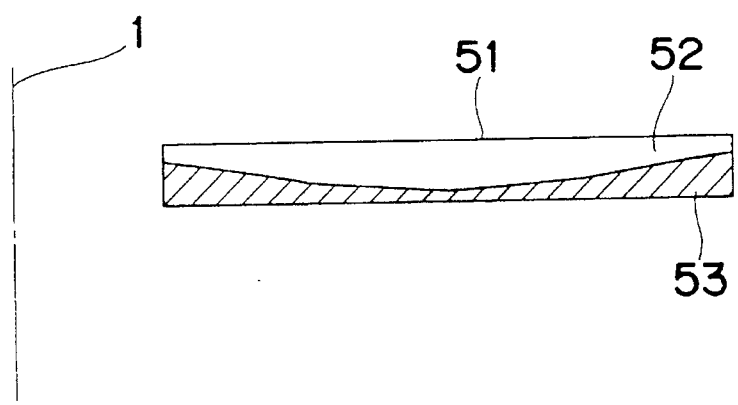
FIG. 3 is a diagram of a sputtered surface of a target when the target is used to a using limit in the embodiment.
Figure 11:
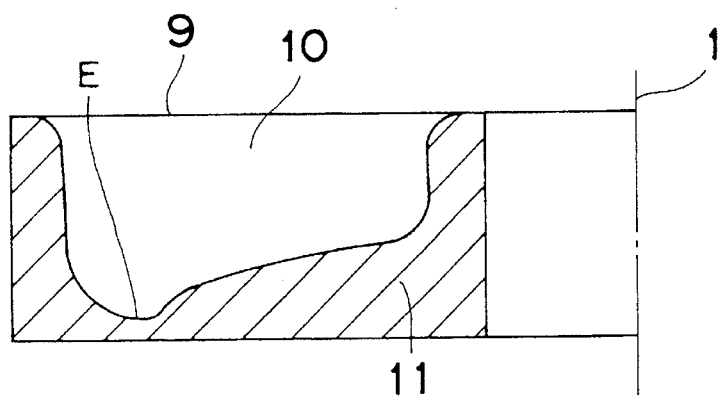
FIG. 11 is a diagram of a sputtered surface when a target is used to a using limit in another prior art.

FIG. 3 is a sectional view of the sputtered target including the central axis 1 when the target is used to the using limit. A symmetric part of the target with respect to the central axis 1 is not shown in FIG. 3. The target before sputtering is in a shape designated by 51. 52 is a sputtered part of the target and 53 is a part remaining without being sputtered. At this time, the voluminal using efficiency including the volume inside the inner periphery of the target is 57% remarkably improved as compared with the conventional using efficiency of 40% in FIG. 11.

Figure 4:
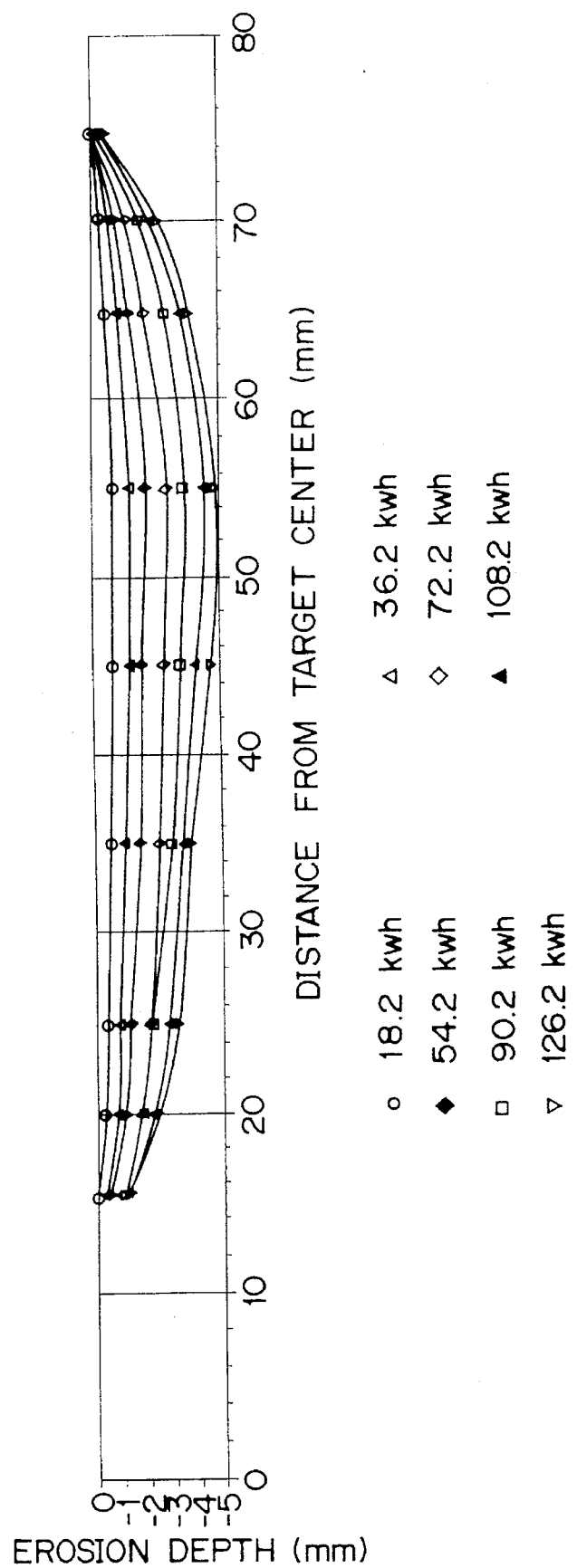
FIG. 4 is a graph of a change with time of the sputtered surface of the target in the embodiment.

FIG. 4 shows the shape of the sputtered target with respect to integrating watts, i,e, a change with time of the sputtered target when the target of FIGS. 1A and 1B is used to the using limit. An axis of abscissa indicates a distance from the central axis, namely, center of the target and an axis of ordinate shows a depth of the erosion by sputtering. Each curve represents an eroded surface when the respective integrating watt is impressed to the target. As is understood from this diagram, the target is sputtered all over the surface thereof from the early stage of sputtering until the target is used to the using limit. The shape of the sputtered target is hardly changed, in other words, a stable thin film is formed on a substrate in the embodiment. Moreover, the sputtering proceeds locally nowhere in the embodiment, thus increasing the using efficiency of the target.

Figure 5:
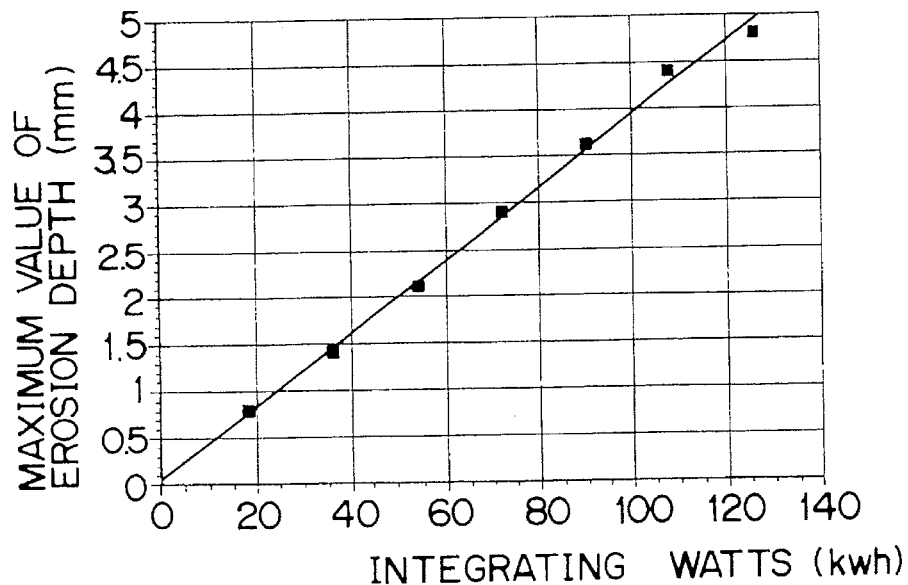
FIG. 5 is a graph of a change with time of a depth of the sputtered target in the embodiment.

FIG. 5 is a graph of the relationship between maximum values of the depth of the erosion and integrating watts, that is, a graph of a change with time of maximum values of the depth of the erosion. The sputtering speed is almost constant and the number of particles sputtered from the target per unit time is hardly changed with time.

Figure 6:
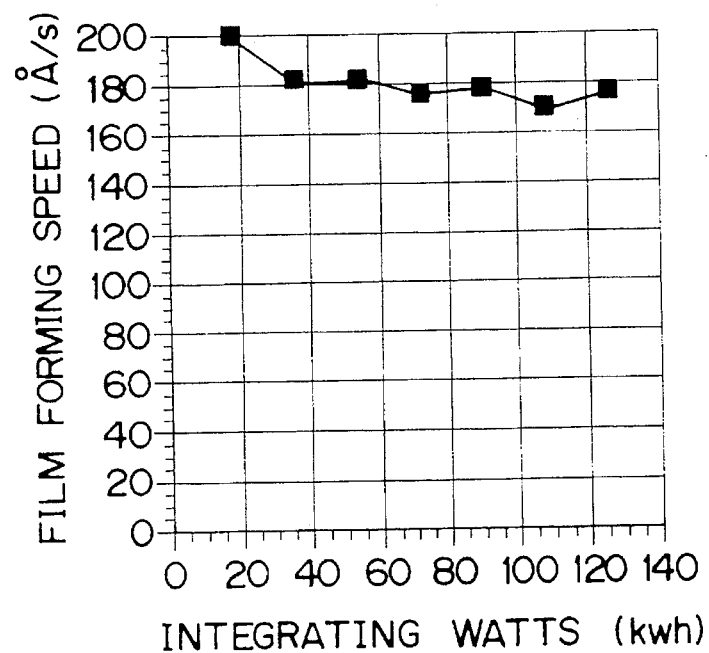
FIG. 6 is a graph of a change with time of a film forming speed to a substrate in the embodiment.

FIG. 6 is a graph of the relationship between film forming speeds and integrating watts when the target is used to the using limit, namely, a graph of a change with time of the film forming speed. The film forming speed is detected at a central point of the substrate. The changing rate of the film forming speed is 10% in the embodiment, which is a great improvement from the conventional 20% or so.

Figure 7:
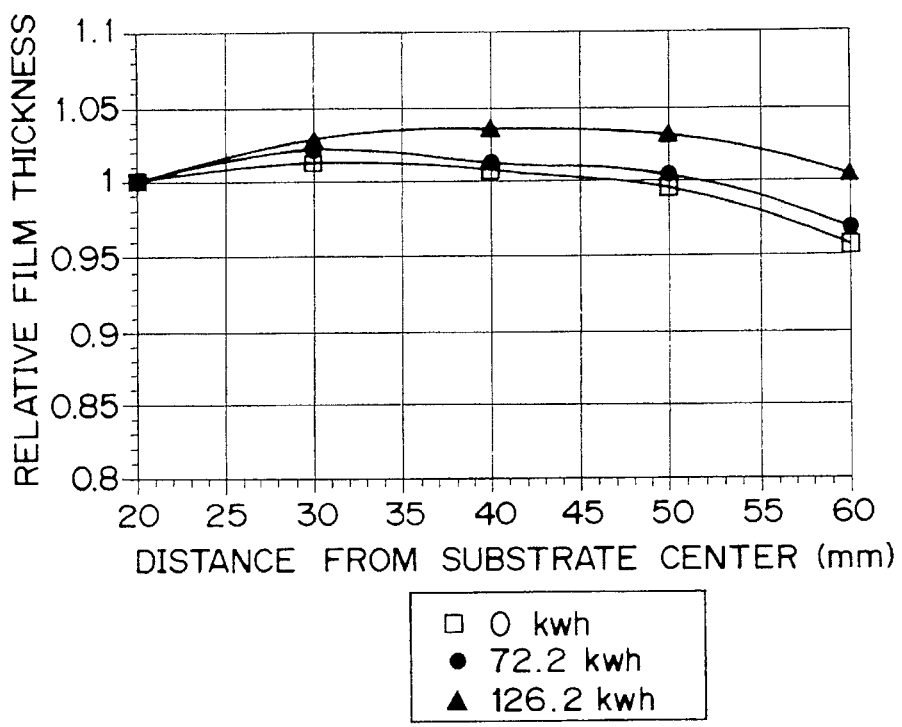
FIG. 7 is a graph of a change with time of a film thickness distribution in the substrate in the embodiment.
Figure 8:
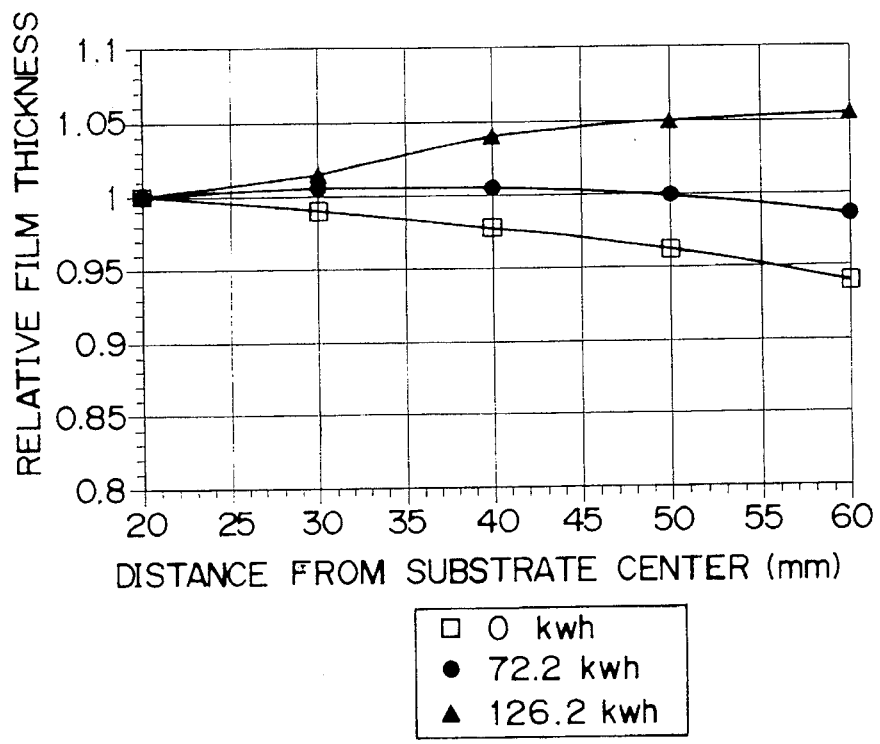
FIG. 8 is a graph of a change with time of a film thickness distribution in a substrate of the prior art.
Figure 9:
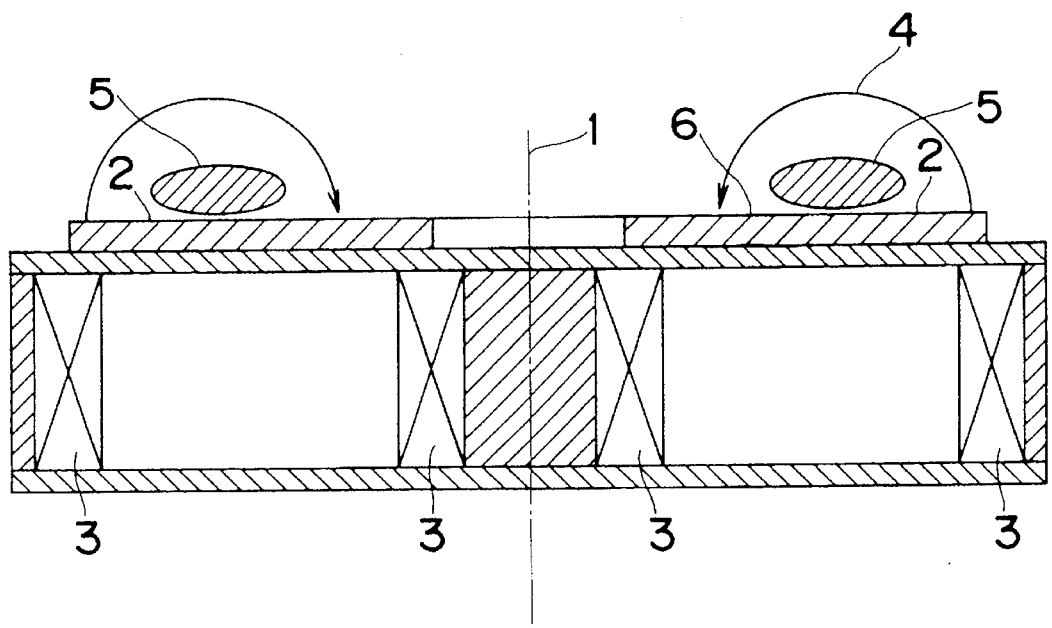
FIG. 9 is a structural diagram of the prior art.
Figure 10:
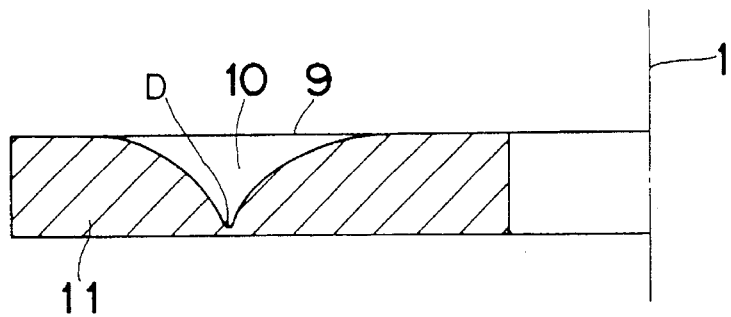
FIG. 10 is a diagram of a sputtered surface when a target is used to a using limit in the prior art.

FIG. 7 shows a change with time of the thickness distribution with respect to integrating watts when the target of FIG. 1 is used to the using limit, in which an axis of ordinate is a relative film thickness when an edge of the inner periphery of a substrate has a thickness of 1. As is clear from FIG. 7, the thin film is formed nearly without a change with time all over the surface of the substrate. The thickness distribution is uniform and held within 5% from the sputtering start of the target to the sputtering end. In comparison with FIG. 8 of the thickness distribution of the prior art, the irregularity in the thickness distribution due to the erosion of the target by sputtering is greatly improved, and therefore the thin film is formed stably. A moving device 71 such as a cylinder may be provided for moving the yoke 35 along the central axis 1 thereof in FIG. 1A. The moving device 71 moves the yoke 35 along the central axis, that is, vertically in FIG. 1A based on the result of FIG. 4 so as to approximately adjust on the surface of the target 2 the point(s) where the lines of magnetic force are paralleled to the surface of the target 2. Aa a result thereof, the erosion of the surface of the target 2 may be progressed all over the surface of the target 2 to form a more uniform thin film on a substrate.

Figure 1C:
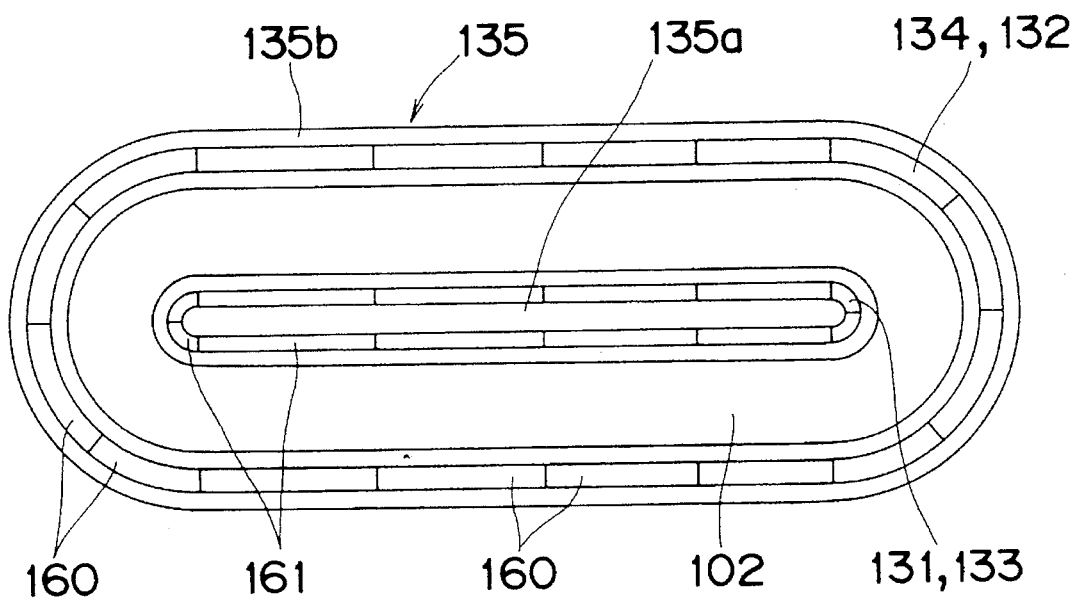
FIG. 1C is a plan view of a magnetron sputtering apparatus according to another embodiment of the present invention.

The present invention is not limited to the above embodiment in FIGS. 1A and 1B but may be applied to an oval-ring-shaped target 102 in FIG. 1C. In this embodiment, the target 102 may be composed of a plurality of separated members. Magnets 131, 133, 134, 132 corresponding to the magnets 31, 33, 34, 32 in FIGS. 1A and 1B each may be composed of a plurality of separated members. In FIG. 1C, 135, 135a, 135b denote the yoke, the center part thereof, and the outer peripheral part thereof corresponding to 35, 35a, 35b in FIGS. 1A and 1C, respectively.

According to the present invention, even though the target is used to the using limit, a uniform thin film can be stably formed on the substrate. The efficiency using the target which is expensive can be increased with any loss decreased.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. In a magnetron sputtering apparatus including a ring-shaped flat target, the ring-shaped flat target having an inner peripheral edge and an outer peripheral edge and opposite front and rear surfaces defining respective target planes of the target, the improvement comprising:

first and second magnets of the same polarity located on a front side and a rear side, respectively, of the respective target planes and extending along the inner peripheral edge of the target; and third and fourth magnets of the same polarity located on the front side and the rear side, respectively, of the respective target planes and extending along the outer peripheral edge of the target, wherein the polarity of the first and second magnets extending along the inner peripheral edge is opposite to the polarity of the third and fourth magnets extending along the outer peripheral edge.

2. In a magnetron sputtering apparatus as claimed in claim 1, wherein an intensity of each magnet is such that there is one point in a radial direction of the target where a direction of a magnetic field is parallel to the front surface of the target on the front surface of the target.

3. In a magnetron sputtering apparatus as claimed in claim 2, the improvement further comprising a first earth shield for covering the first and second magnets on a magnetron sputtering generating side of the apparatus, and a second earth shield for covering the third and fourth magnets on the magnetron sputtering generating side of the apparatus, the first and second shields being insulated from the target and earthed or floated.

4. In a magnetron sputtering apparatus as claimed in claim 3, wherein the first and second shields include passageways for running of a cooling fluid to cool the first and second shields with the cooling fluid.

5. In a magnetron sputtering apparatus as claimed in claim 2, the improvement further comprising:

a yoke supporting the first through fourth magnets and movable along a central axis of the yoke normal to the target planes to change a relative position of the first through fourth magnets and the target planes; and a moving device for moving the yoke along the central axis.

6. In a magnetron sputtering apparatus as claimed in claim 1, the improvement further comprising a first earth shield for covering the first and second magnets on a magnetron sputtering generating side of the apparatus, and a second earth shield for covering the third and fourth magnets on the magnetron sputtering generating side of the apparatus, the first and second shields being insulated from the target and earthed or floated.

7. In a magnetron sputtering apparatus as claimed in claim 6, wherein the first and second shields include passageways for running of a cooling fluid to cool the first and second shields with the cooling fluid.

8. In a magnetron sputtering apparatus as claimed in claim 7, the improvement further comprising:

a yoke supporting the first through fourth magnets and movable along a central axis of the yoke normal to the target planes to change a relative position of the first through fourth magnets and the target planes; and a moving device for moving the yoke along the central axis.

9. In a magnetron sputtering apparatus as claimed in claim 6, the improvement further comprising:

a yoke supporting the first through fourth magnets and movable along a central axis of the yoke normal to the target planes to change a relative position of the first through fourth magnets and the target plane; and a moving device for moving the yoke along the central axis.

10. In a magnetron sputtering apparatus as claimed in claim 1, the improvement further comprising:

a yoke supporting the first through fourth magnets and movable along a central axis of the yoke normal to the target planes to change a relative position of the first through fourth magnets and the target planes; and a moving device for moving the yoke along the central axis.

11. In a magnetron sputtering apparatus as claimed in claim 1, the improvement further comprising an electrode located on the rear side of the target for supplying an electric power to the target and having a passageway for running of a cooling fluid to cool the electrode with the cooling fluid.

12. A magnetron sputtering method in which a plasma is generated in a vicinity of a ring-shaped flat magnet arranged facing a substrate in a vacuum chamber to form a thin film on the substrate, the ring-shaped flat target having an inner peripheral edge and an outer peripheral edge and opposite front and rear surfaces defining respective target planes of the target, comprising steps of:

arranging first and second magnets of the same polarity at a front side and a rear side, respectively, of the respective target planes so as to extend along the inner peripheral edge of the target;

arranging third and fourth magnets of the same polarity at the front side and the rear side, respectively, of the respective target planes so as to extend along the outer peripheral edge of the target, wherein the polarity of the first and second magnets extending along the inner peripheral edge is opposite to the polarity of the third and fourth magnets extending along the outer peripheral edge of the target, and wherein a magnetic field is formed by the first through fourth magnets which is approximately parallel to a front surface of the target and has an approximately uniform intensity so as to distribute the plasma in an approximately uniform condition; and supplying an electric power to the target and forming the thin film on the substrate.

13. The magnetron sputtering method as claimed in claim 12, wherein an intensity of each magnet is regulated so that there is one point in a radial direction of the target where a direction of the magnetic field is parallel to the front surface of the target on the front surface of the target.

14. The magnetron sputtering method as claimed in claim 13, further comprising providing a first earth shield for covering the first and second magnets on a magnetron sputtering generating side of the vacuum chamber, and a second earth shield for covering the third and fourth magnets on the magnetron sputtering generating side of the vacuum chamber, the first and second shields being insulated from the target and earthed or floated.

15. The magnetron sputtering method as claimed in claim 14, wherein the first and second shields are provided having passageways for running of a cooling fluid to cool the first and second shields with the cooling fluid.

16. The magnetron sputtering method as claimed in claim 13, further comprising providing a yoke for supporting the first through fourth magnets which is movable along a central axis of the yoke normal to the target planes to change a relative position of the first through fourth magnets and the target planes, and a moving device is provided for moving the yoke along the central axis.

17. The magnetron sputtering method as claimed in claim 12, further comprising providing a first earth shield for covering the first and second magnets on a magnetron sputtering generating side of the vacuum chamber, and a second earth shield for covering the third and fourth magnets on the magnetron sputtering generating side of the vacuum chamber, the first and second shields being insulated from the target and earthed or floated.

18. The magnetron sputtering method as claimed in claim 17, wherein the first and second shields are provided having passageways for running of a cooling fluid to cool the first and second shields with the cooling fluid.

19. The magnetron sputtering method as claimed in claim 18, further comprising providing a yoke for supporting the first through fourth magnets which is movable along a central axis of the yoke normal to the target planes to change a relative position of the first through fourth magnets and the target planes, and a moving device is provided for moving the yoke along the central axis.

20. The magnetron sputtering method as claimed in claim 17, further comprising providing a yoke for supporting the first through fourth magnets which is movable along a central axis of the yoke normal to the target planes to change a relative position of the first through fourth magnets and the target planes, and a moving device is provided for moving the yoke along the central axis.

21. The magnetron sputtering method as claimed in claim 12, further comprising providing a yoke for supporting the first through fourth magnets which is movable along a central axis of the yoke normal to the target planes to change a relative position of the first through fourth magnets and the target planes, and a moving device is provided for moving the yoke along the central axis.

22. The magnetron sputtering method as claimed in claim 12, further comprising providing an electrode for supplying the electric power to the target, the electrode being provided below the target and having a passageway for running of a cooling fluid to cool the electrode with the cooling fluid.

* * * * *